(12) United States Patent
Dong

(10) Patent No.: US 8,559,482 B1
(45) Date of Patent: Oct. 15, 2013

(54) IMPLEMENTATION OF MULTI-CHANNEL INTERMEDIATE FREQUENCY MODEM FOR RADIO COMMUNICATION WITH A PROGRAMMABLE INTEGRATED CIRCUIT

(75) Inventor: Xiaofei Dong, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 1168 days.

(21) Appl. No.: 12/476,129

(22) Filed: Jun. 1, 2009

(51) Int. Cl.
*H04B 1/00* (2006.01)
(52) U.S. Cl.
USPC ............................ 375/146; 375/130; 375/140
(58) Field of Classification Search
None
See application file for complete search history.

(56) References Cited

U.S. PATENT DOCUMENTS

| | | | | |
|---|---|---|---|---|
| 6,539,209 | B1 * | 3/2003 | Dajer et al. | 455/101 |
| 2003/0228845 | A1 * | 12/2003 | Peng et al. | 455/67.11 |
| 2007/0211821 | A1 * | 9/2007 | Haque et al. | 375/297 |

* cited by examiner

*Primary Examiner* — Shuwang Liu
*Assistant Examiner* — Gina McKie
(74) *Attorney, Agent, or Firm* — Womble Carlyle Sandridge & Rice, LLP

(57) ABSTRACT

Embodiments of the present invention provide methods and systems for implementing a digital up converter (DUC) in an integrated circuit (IC). The method includes serializing a plurality of inputs to obtain a serial output and then increasing the sample rate of the serial output. Additionally, the method generates signal pairs (sine, cosine) for the desired carrier frequencies using time division multiplexing (TDM). Some of the signal pairs are delayed by one period within the TDM cycle to generate delayed signal pairs. The serial output is distributed, after the increase of the sample rate, to a plurality of filters to further increase the sample rate, each filter outputting a subset of the plurality of inputs using TDM. In one embodiment, the plurality of inputs includes 8 input pairs and the plurality of filters includes 6 Cascaded Integrator-Comb (CIC) filters operating in three-fold TDM. Further, one operation of the method combines the outputs from the plurality of filters with one of the signals from a corresponding signal pair or delayed signal pair. The result of the combination is sent to a digital to analog converter for transmission by one or more antennas.

20 Claims, 9 Drawing Sheets

IMPLEMENTATION OF MULTI-CHANNEL INTERMEDIATE FREQUENCY MODEM FOR RADIO COMMUNICATION WITH A PROGRAMMABLE INTEGRATED CIRCUIT

BACKGROUND

The present invention relates to methods and apparatus for implementing digital radio communication modems with an Integrated Circuit (IC), and more particularly, methods and ICs for implementing the digital up converters (DUC) of intermediate frequency (IF) modems.

Emerging wireless applications such as remote radio heads, WiMAX customer premises equipment (CPE), and software defined radio (SDR) have stringent power consumption and low cost requirements. In addition to these challenges, given the high data rate requirements and ever-evolving standards, designers also need to ensure high performance and flexibility in the end products. Programmable logic devices, such as those owned by Altera Corporation, the assignee of the present application, can be used to meet these requirements for wireless applications at a relative low cost.

Market needs for higher data rates are driving the evolution of wireless cellular systems from narrowband 2G IS-95 systems to current-generation Wideband Code Division Multiple Access (W-CDMA) based 3G and 3.5G systems supporting peak data rates up to 10 Mbps. For future 3rd Generation Partnership Project (3GPP) long-term evolution (LTE) specifications, complex signal processing techniques such as multiple-input multiple-output (MIMO), along with new radio technologies like Orthogonal Frequency-Division Multiple Access (OFDMA), are considered key to achieving target throughputs in excess of 100 Mbps.

The emerging wireless technologies described above pose significant challenges for equipment manufacturers needing to design products that are not only scalable and cost-effective but also flexible and reusable across multiple evolving standards. One piece of digital front end hardware must now be able to handle much more complex digital signal processing at a much higher data rate. For instance, in systems featuring OFDM modulation, crest factor reduction (CFR) and digital pre-distortion (DPD) have become requirements. These advanced signal processing techniques are usually computationally intensive and therefore require a significant amount of silicon (logic area). Consequently, the digital front end implementation must be hardware efficient. Resource reuse is therefore critical and is one of the major driving forces behind digital front end implementation optimization.

It is in this context that embodiments of the invention arise.

SUMMARY

It should be appreciated that the present invention can be implemented in numerous ways, such as a process, an apparatus, a system, a device or a method on a computer readable medium. Several inventive embodiments of the present invention are described below.

Embodiments of the present invention provide methods and systems for implementing a digital up converter (DUC) in an integrated circuit (IC). The method includes serializing a set of input pairs to obtain a serial output and then increasing the sample rate of the serial output. Additionally, the method generates signal pairs (sine, cosine) for the desired carrier frequencies using time division multiplexing (TDM). Some of the signal pairs are delayed by one period within the TDM cycle to generate delayed signal pairs. After increasing the sample rate of the serial output, the serial output is distributed to a plurality of filters to further increase the sample rate, where each filter outputs a subset of the plurality inputs using TDM. In one embodiment, there are 8 input pairs and the plurality of filters includes 6 Cascaded Integrator-Comb (CIC) filters operating in three-fold TDM. Further, one operation of the method combines the outputs from the plurality of filters with one of the signals from a corresponding signal pair or delayed signal pair. The result of the combination is sent to a digital-to-analog converter for transmission by one or more antennas.

Some embodiments presented implement an efficient digital up converter in an integrated circuit for macro-cell wide band CDMA digital intermediate frequency (IF) modems. The IC clock rate is 96× the base band sample rate in one embodiment. The methods presented enable maximum utilization of time sharing of existing hardware for multiple channel support, minimal hardware duplication, and minimal control logic overhead.

In another embodiment, a DUC in an IC includes a multiplexer, a first filter, a plurality of numerically controlled oscillators (NCO), unit delay modules, a plurality of second filters, and combination logic circuitry to generate the output. The multiplexer serializes a plurality of inputs to obtain a serial output, and the first filter increases the sample rate of the serial output. Further, each NCO generates a signal pair and the unit delay modules delay one of the signal pairs to generate a delayed signal pair. The second filters receive the serial output from the first filter and further increase the sample rate, each second filter outputting a subset of the plurality of inputs. The combination logic circuitry generates an output signal by combining the second filter outputs and one of a signal pair or the delayed signal pair. In yet another embodiment, the DUC also includes a plurality of mask modules but does not necessarily include the delayed signal pairs. The mask modules filter out signals corresponding to a dummy input and signals corresponding to a different antenna.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

Digital intermediate frequency (IF) processing provides the bridge between the baseband and analog radio frequency (RF) portions of a wireless modem. A wireless system must convert between the low baseband sampling frequency and a high IF. Furthermore, a wireless system must mix the IF signal with a suitable carrier frequency. Typically, these conversions are achieved using a digital up converter (DUC) to convert between baseband and IF and a digital down converter (DDC) to convert between IF and baseband. These systems are implemented with interpolators and decimators and low pass filters that remove undesirable spectral imaging and protect against aliasing.

The trend in wireless base stations specifications is towards multiple antennas, multiple carriers, and complex multiple input multiple output (MIMO) techniques. Consequently, the digital IF modules are required to process many different channels. A programmable logic device provides an excellent platform for this type of design, because of the high-speed dedicated multiplier units and the parallel nature of hardware. In addition, the maximum frequency of operation of modern FPGA devices is much greater than the sampling frequency of the system, allowing the time-sharing of hardware resources to process multiple channels. This time sharing reduces the overall implementation cost.

The methods and systems presented describe an efficient Digital Up Converter implementation in an integrated circuit for macro-cell wide band CDMA digital Intermediate Frequency Modems. In one embodiment, the IC clock rate is 96× the base band sample rate. Embodiments presented allow for maximum utilization of existing hardware for multiple channel support, with minimal hardware duplication and minimal control logic overhead.

It will be obvious, however, to one skilled in the art, that the present invention may be practiced without some or all of these specific details. In other instances, well known process operations have not been described in detail in order not to unnecessarily obscure the present invention.

Embodiments for implementing a Digital Down Converter (DDC) are not presented as the logic employed minors the logic presented for the DUC. The person skilled in the art would readily appreciate how to implement a DDC given the principles presented here for implementing a DUC.

Figure 1:
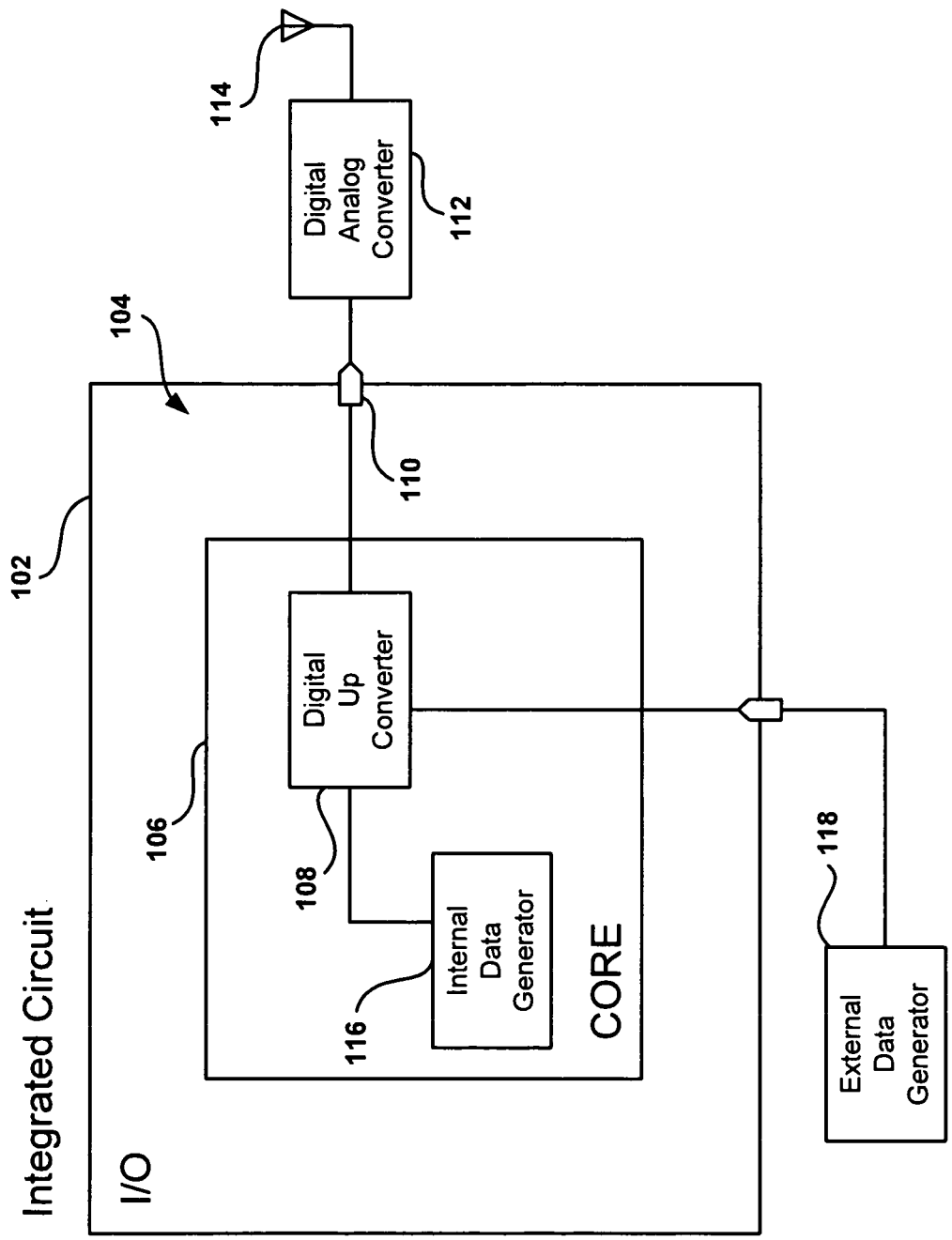
FIG. 1 includes the schematic of an Integrated Circuit for implementing embodiments of the invention.

FIG. 1 includes the schematic of an Integrated Circuit for implementing embodiments of the invention. Integrated Circuit (IC) 102 includes an Input/Output (I/O) ring 104 and core logic 106. Digital Up Converter 108, described in more detail below, performs digital data processing and sends the required output to Digital Analog Converter (DAC) 112 via I/O pin 110. DAC 112 outputs the analog signal to antenna 114 for radio transmission of the data. In other embodiments, DUC 108 generates signals for a larger number of antennas, such as 2, 4, 8, etc. The input data for DUC 108 can be originated by another module inside the IC, such as internal data generator 116, or can be received from an outside entity such as External Data Generator 118.

Figure 2:
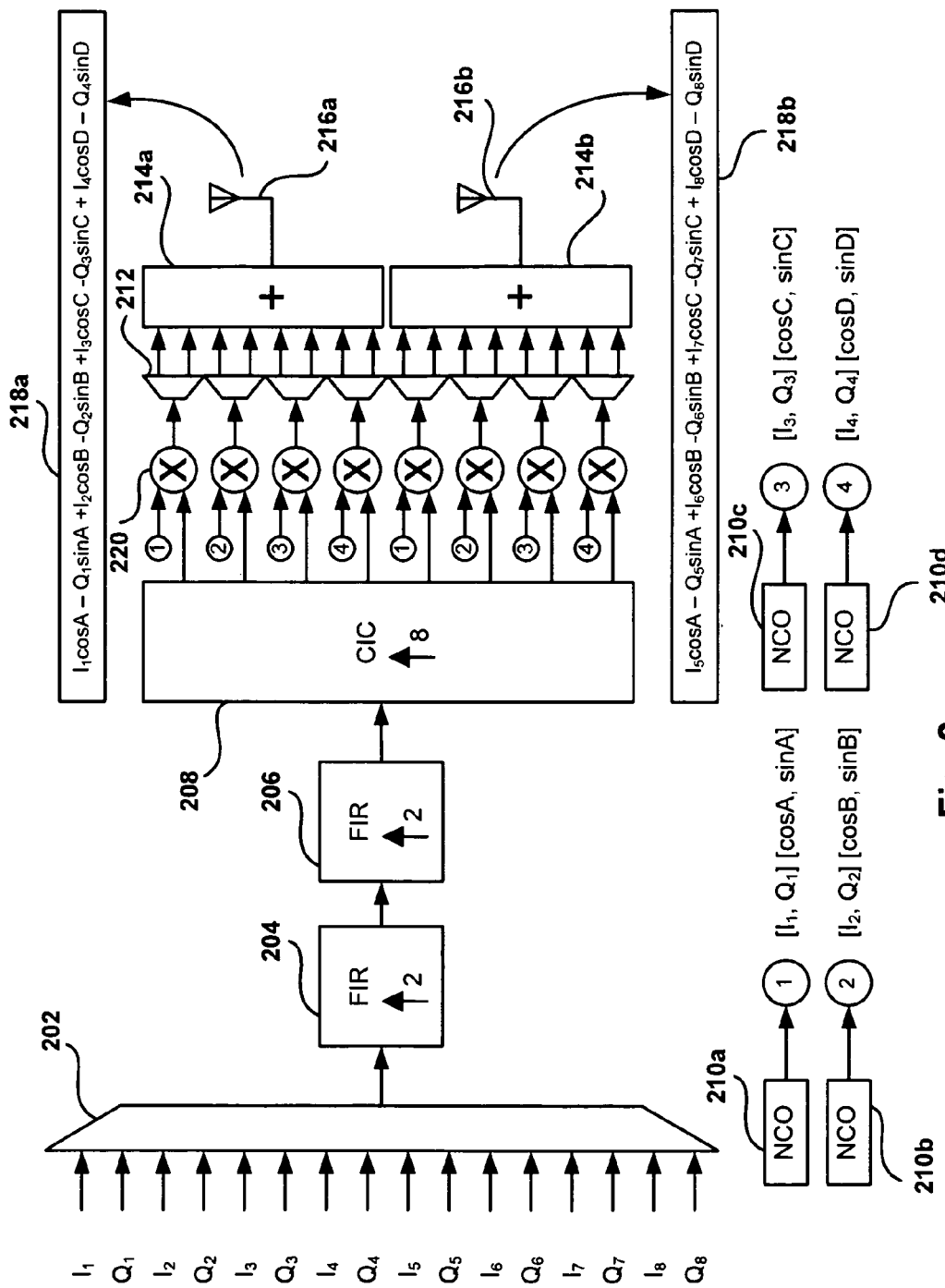
FIG. 2 illustrates a block diagram of a macro-cell WCDMA digital up converter (DUC), in accordance with one embodiment.

FIG. 2 illustrates an embodiment of a block diagram for a macro-cell WCDMA digital up converter, such as DUC 108 of FIG. 1. There are 16 input data channels, $I_1$-$I_8$ plus $Q_1$-$Q_8$, with four IF carriers, and two MIMO antennas 216a-b. Each (I, Q) pair represents the real and imaginary part of a complex signal where I is the in-phase signal and Q is the quadrature signal. In one embodiment, I and Q are each 16-bit wide signals. The number of antennas is a design choice as other embodiments may use more or less antennas.

The 16 inputs are connected to multiplexer 202 which serializes the inputs into a serial output that is transmitted to FIR 204. In one embodiment a select signal is supplied to multiplexer 202 to select the input as one skilled in the art will appreciate. FIR filters are based on the sum of product terms where each product term is calculated by multiplying a coefficient and a delayed data input. The dedicated multipliers reduce the IC logic resource needed and improve overall clock speeds. The output of FIR 204 has a sample rate that is double the sample rate of the input. More details on the frequencies at the different stages as well as cycle counts are given below in reference to FIG. 3. FIR 204 is connected to FIR 206 for another doubling of the data rate.

The output of FIR 206 is fed to CIC 208. A Cascaded Integrator-Comb (CIC) filter is a class of hardware-efficient linear phase finite impulse response (FIR) digital filter. CIC filters achieve sampling rate decrease (decimation) and sampling rate increase (interpolation) without using multipliers. A CIC filter consists of an equal number of stages of ideal integrator filters and comb filters. The frequency response of the CIC filter may be tuned by selecting the appropriate number of cascaded integrator and comb filter pairs. The highly symmetric structure of a CIC filter allows efficient implementation in hardware.

CIC 208 is implemented using 8 CICs, as described below in more detail in reference to FIG. 5. The 8 outputs of CIC 208 are combined with outputs from four Numerically Controlled Oscillators (NCO) 210a-d. A Numerically Controlled Oscillator is a digital signal generator, which synthesizes a discrete-time, discrete-valued representation of a sinusoidal waveform. When used in communication systems, NCOs are typically used as quadrature carrier generators in I-Q mixers, in which baseband data is modulated onto the orthogonal carriers in one of a variety of ways. NCOs can also be used in all-digital phase-locked loops (PLLs) for carrier synchronization in communications receivers, or as standalone frequency shift keying (FSK) or phase shift keying (PSK) modulators. NCOs 210a-d generate 4 sine and cosine signal pairs for frequencies A-D. At the end of the up converter data path, the 8 complex data channels are properly mixed, by complex mixer 220, with sinusoidal signals that come from NCOs using dot-product multiplication. It should be noted that the sine and cosine functions are exemplary complementary signals. Other embodiments may use different complementary signals in order to achieve different waveforms necessary to implement different radio communication protocols.

CIC 208, NCO 210a-d, and complex mixer 220 of FIG. 2 use two-fold TDM, thus the results from each cycle are combined using demultiplexers 212, which transfer the outputs to adders 214a-b. The final results transferred to antennas 216a-b are expressed by formulas 218a-b respectively. Thus, the outputs to antennas 216a-b are expressed respectively as:

$$I_1 \cos A - Q_1 \sin A + I_2 \cos B - Q_2 \sin B + I_3 \cos C - Q_3 \sin C + I_4 \cos D - Q_4 \sin D \quad (1)$$

$$I_5 \cos A - Q_5 \sin A + I_6 \cos B - Q_6 \sin B + I_7 \cos C - Q_7 \sin C + I_8 \cos D - Q_8 \sin D \quad (2)$$

In one embodiment, the WCDMA IF modem is implemented with an IC with a clock rate of 245.76 MHz, or 64× of the base band data sample rate at 3.84 MHz. The total rate change factor of the up converter is 32. This choice of rate change factor and IC clock rate allows efficient and straightforward implementation of signal mixing between the filter cascade and NCOs. The hardware implementation at the end of the data path is shown in more detail below in reference to FIG. 5. The resulting CIC and NCO signal mixing and summation are straightforward, and there is minimum control logic overhead.

Figure 3:
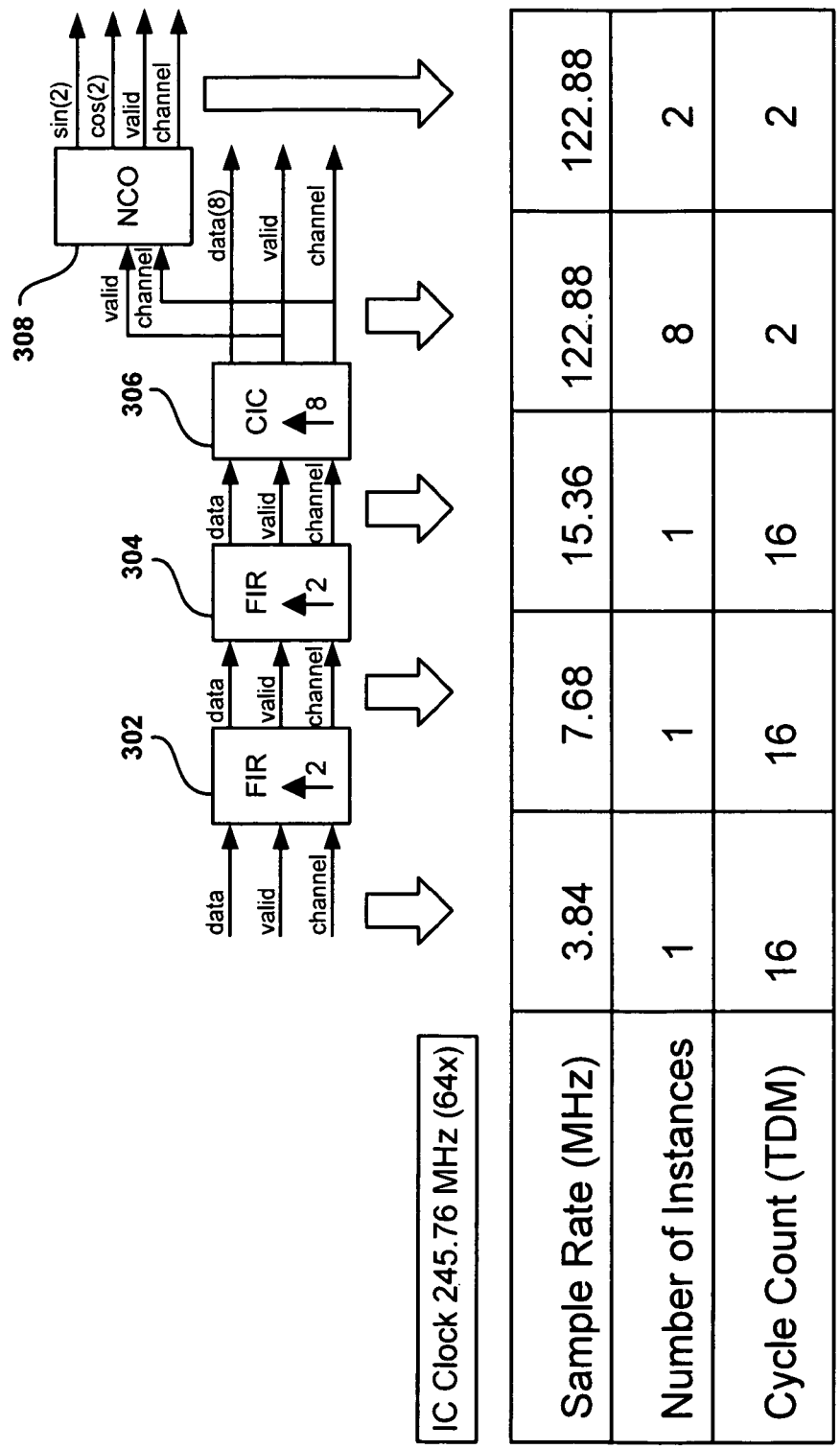
FIG. 3 illustrates values of input and output parameters for the modules used to implement a DUC, according to one embodiment.
Figure 4:
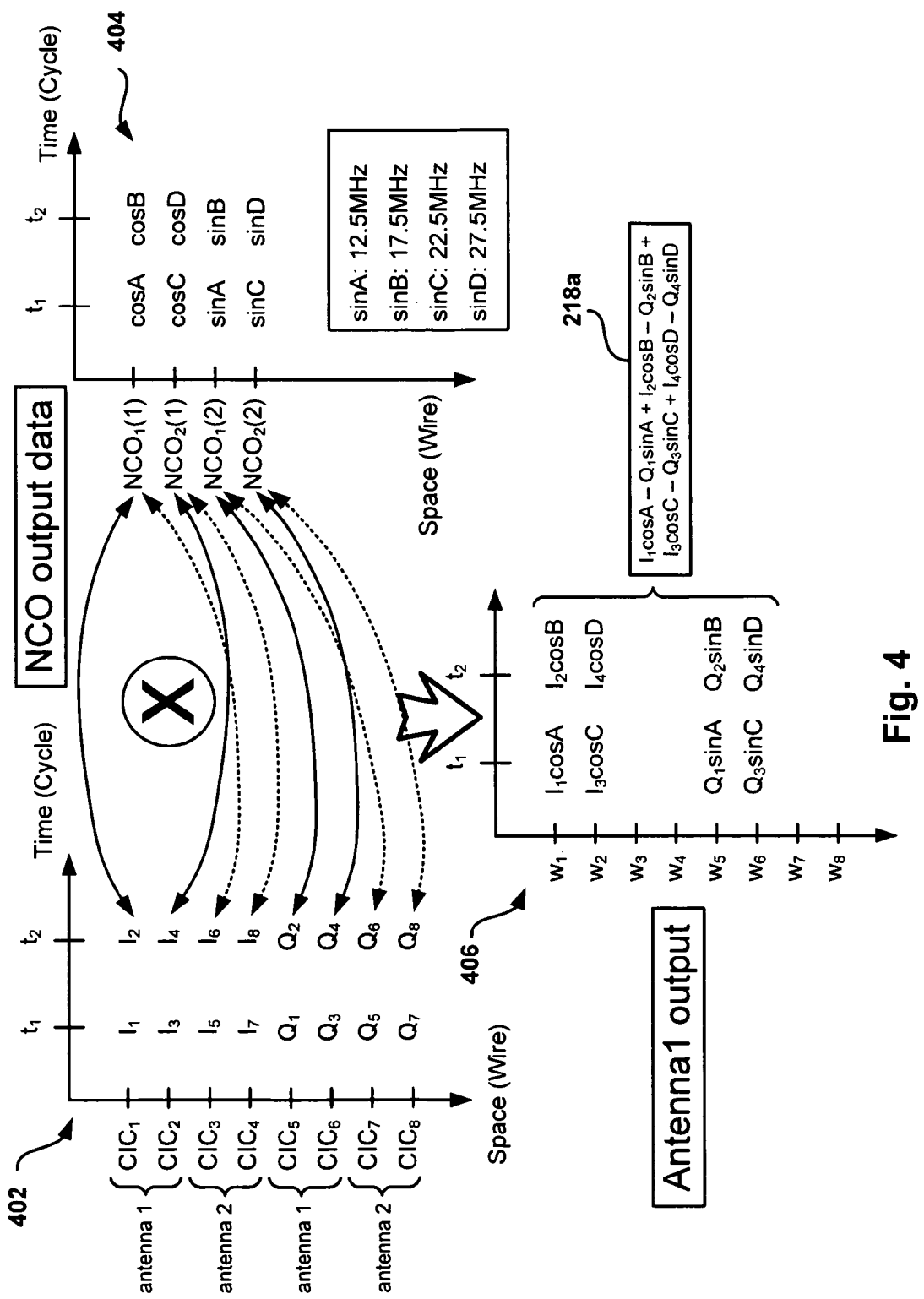
FIG. 4 illustrates CIC and NCO output data for implementing a DUC, according to one embodiment.

FIG. 3 illustrates values of input and output parameters for the modules used to implement a DUC, according to one embodiment. The WCDMA design of FIGS. 2-4 is based on an IC clock rate of 245.76 MHz, or 64 times the baseband frequency of 3.84 MHz. Sixteen data channels are supported, with four carriers and two antennas. The sample rate table of FIG. 3 shows a sample rate of 3.84 MHz at the initial stage, with one instance of the data channel at FIR 302, and a cycle count (number of periods in a TDM cycle) of 16.

At the output of FIR 302, the sample rate has doubled to 7.68 and the number of instances and cycle counts remain the same at 1 and 16 respectively. Similarly, the output of FIR 304 shows a doubled rate of 15.36 MHz with respect to the previous stage.

The sample rate is multiplied by 8 in CIC 306 with respect to its input, thus the sample rate is 122.88 MHz and the number of instances has increased to 8, meaning that there are 8 instances of the CIC filters to handle the 16 data channels, while the cycle count has been reduced to 2 because of two-fold TDM. Finally, the last column of the sample rate table shows the values after combining the signals with the NCOs, resulting in sample rate of 122.88 MHz, 2 instances, and a cycle count of 2.

Knowing the number of instances and the cycle count for the input and output of each module assists in determining how easy or difficult is to mix data path signals with the carrier sinusoidal waves, as well as how to sum and split the signals for different antennas. In the embodiment of FIG. 3, the data path signals and the carrier waves can be aligned because the signal pairs for the 4 carriers generated by the two NCOs also utilize two-fold TDM. In addition, the data path signals for the 16 inputs can also be separated into the first or second parts of the TDM period according to which carrier the signal corresponds. This way, complex data mixing and summation are easily performed.

FIG. 4 illustrates CIC and NCO output data for implementing a DUC, according to one embodiment. Diagram 402 represents the output of the CIC. The horizontal axis corresponds to the time or cycle. The cycle includes two periods corresponding to two-fold TDM, therefore there are two columns, $t_1$ for the first half of the cycle, and $t_2$ for the second half. The vertical axis corresponds to the 8 outputs $CIC_1$-$CIC_8$ of the CIC instances. As seen in diagram 402, the outputs are easily distributed where $I_1$, $I_3$, $I_5$, $I_7$ with the corresponding $Q_1$, $Q_3$, $Q_5$, and $Q_7$ appear on $t_1$, and the rest on $t_2$.

Diagram 404 displays the output of the NCO, also broken into outputs for $t_1$ and $t_2$. Thus, $NCO_1$ outputs cos A in one wire and sin A in another wire during $t_1$, and cos B and sin B in $t_2$. $NCO_2$ outputs cos C and sin C in $t_1$, and cos D and sin D in $t_2$. In one embodiment, the frequencies for A-D are 12.5, 17.5, 22.5, and 27.5 MHz respectively. However, this is exemplary as the frequencies may vary.

The goal of performing equations (1) and (2) described above is relatively straightforward, as the different factors align for performing the dot-product multiplications followed by the addition. For example, diagram 406 details the calculation of formula 218a corresponding to equation (1). Thus, $CIC_1$ output is combined with $NCO_1$ (1) output to obtain $I_1$ cos A in $t_1$ and $I_2$ cos B in $t_2$. Similarly the outputs of $CIC_2$, $CIC_5$ and $CIC_6$ corresponding to antenna 1 are combined with the right sine and cosine signals to have the end result required for antenna 1. Each CIC processes two data channels because of the use of two-fold TDM. This allows the reuse of hardware components and decreases the need of components reserved in the IC. It should be appreciated that without the use of two-fold TDM, 16 filters would be required, twice the amount of CICs shown in FIG. 4.

Figure 5:
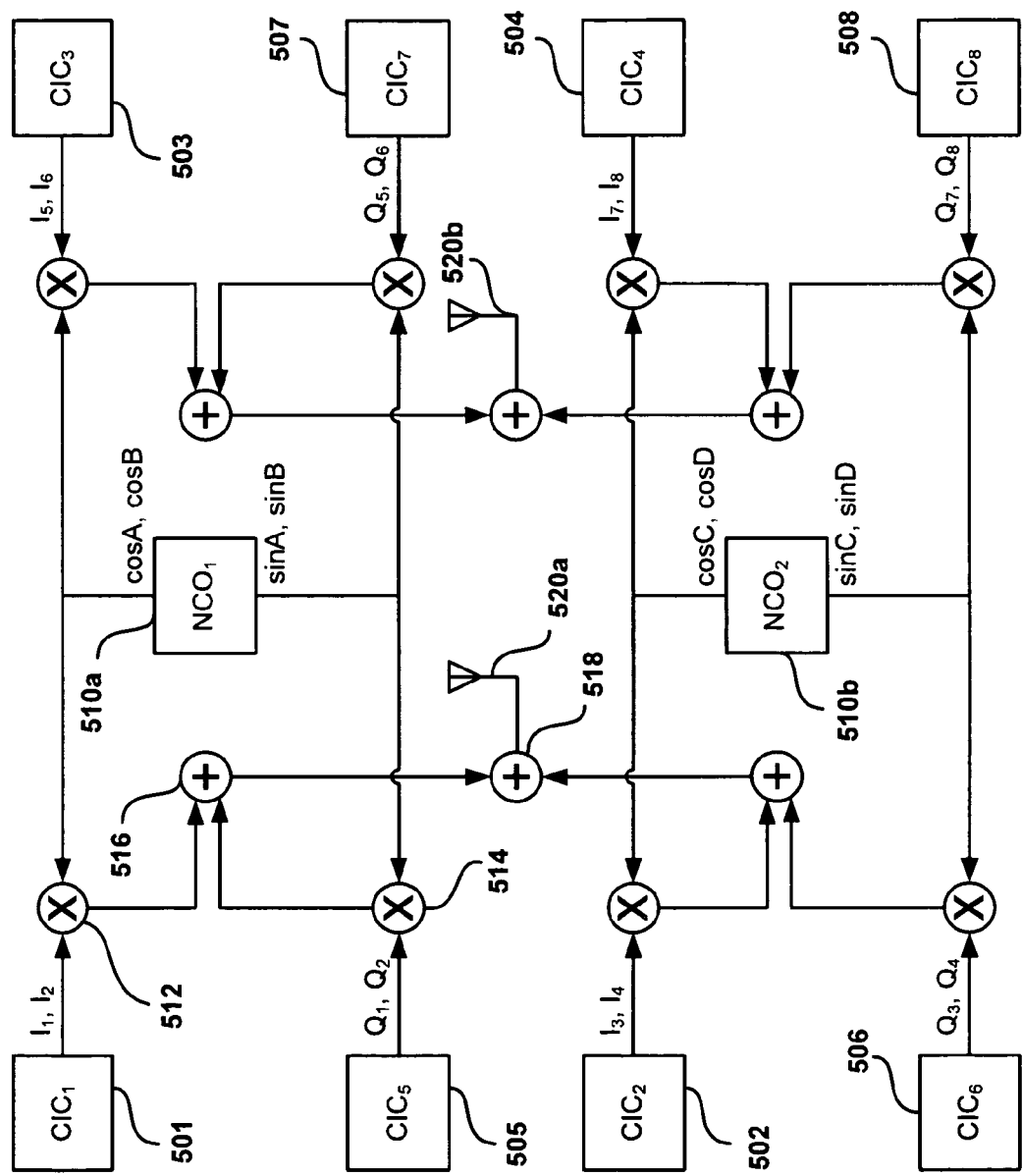
FIG. 5 illustrates an embodiment for implementing a two-fold TDM DUC using eight CICs and two NCOs.

FIG. 5 illustrates an embodiment for implementing a two-fold TDM DUC using eight CICs and two NCOs, as described with reference to FIGS. 2-4. FIG. 5 provides further details on how the signals from the 8 CICs are combined with the outputs from the two NCOs. Eight CICs $CIC_1$-$CIC_8$ 501-508 respectively produce two outputs each, one for the first half of the cycle and another one for the second half. For example, $CIC_1$ outputs $I_1$ and $I_2$, $CIC_2$ outputs $I_3$ and $L_1$, $CIC_3$ outputs $I_5$ and $I_6$, etc.

$NCO_1$ 510a and $NCO_2$ 510b generate the sinusoidal functions previously described. For example, $NCO_1$ 510a outputs cos A and sin A in two different wires during $t_1$. Cos B and sin B are output by $NCO_1$ 510a in $t_2$. Dot-product multipliers combine the sine and cosine signals with corresponding CIC outputs. Thus, dot-product multiplier 512 outputs $I_1$ cos A in $t_1$ and $I_2$ cos B in $t_2$. Dot-product multiplier 514 outputs $Q_1$ sin A in $t_1$ and $Q_2$ sin B in $t_2$. The outputs from dot-multipliers 512 and 514 are added by adder 516. The output of adder 516 is added to a similar partial result from combining $CIC_2$ and $CIC_6$ with $NCO_2$ functions to produce the desired formula at antenna 520a.

It should be appreciated that the embodiments illustrated in FIGS. 3-5 are exemplary DUC implementations. Other embodiments may utilize different layouts or different filter types, such as replacing the CICs with FIR filters. The embodiments illustrated in FIGS. 3-5 should therefore not be interpreted to be exclusive or limiting, but rather exemplary or illustrative.

With the availability of ICs, such as programmable logic devices, e.g., Field-Programmable Gate Arrays (FPGA), using faster clocks, there is a possibility to run at faster multipliers from the baseband, such as 96× using a 368.64 MHz clock. When upgrading the same system to higher clock rate at 368.64 MHz, the same signal configuration as in FIGS. 3-5 can still be used. However, the use of hardware can be optimized because three-fold TDM is possible. Three-fold TDM would allow certain components to perform three different operations per cycle, one on each third of the cycle. As seen in FIG. 3, everything lines up as different parameters are halved or doubled, which is not possible when using three-fold TDM because there are 3 different signals per cycle. However, using three-fold TDM enables further reduction in required components. Accordingly, adapting the system for use with three-fold TDM.

Figure 6:
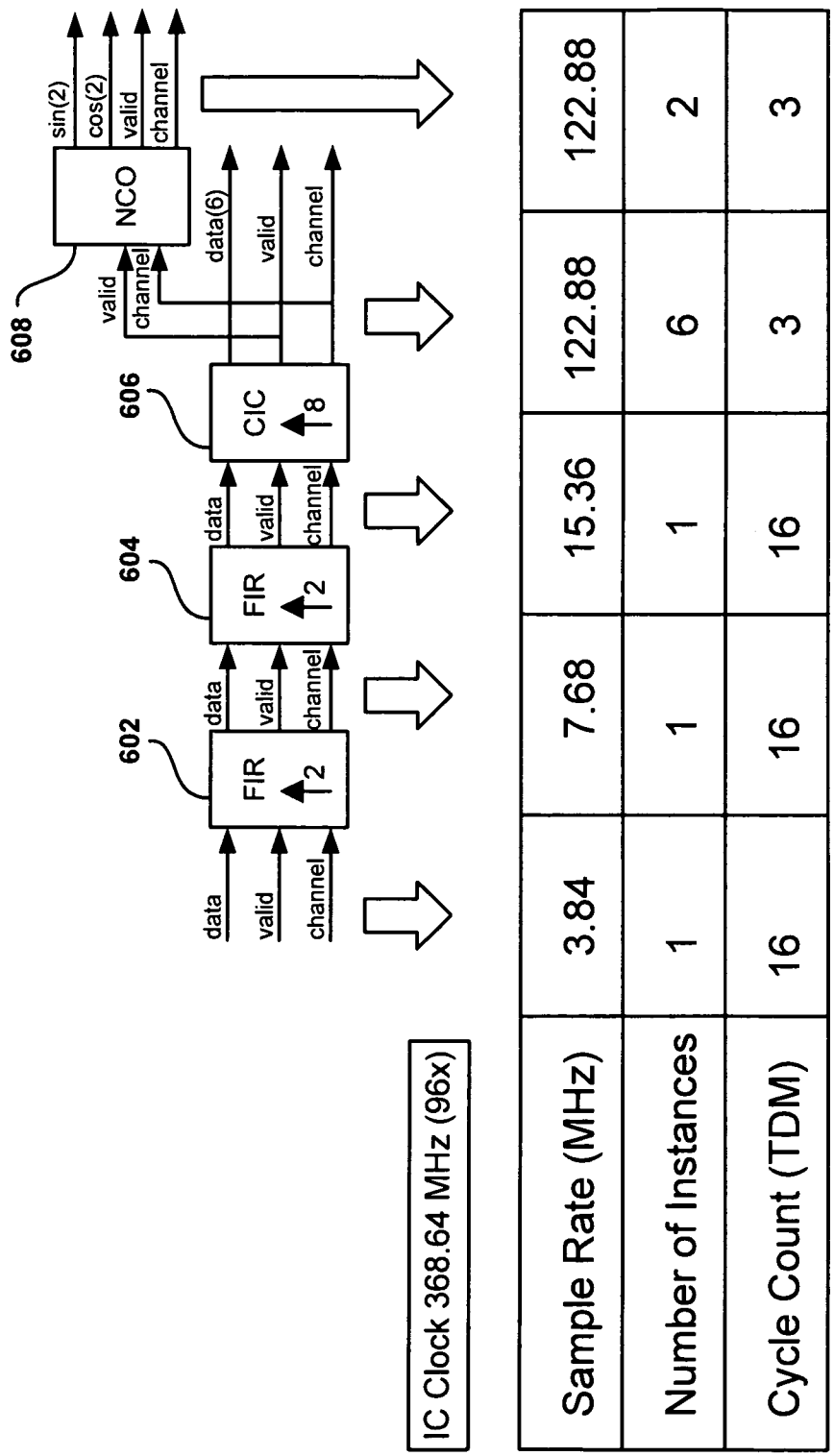
FIG. 6 illustrates values of input and output parameters for the modules used to implement a DUC using three-fold TDM, according to one embodiment.

FIG. 6 illustrates values of input and output parameters for the modules used to implement a DUC using three-fold TDM, according to one embodiment. A higher IC clock rate poses a challenge to efficient implementation of multi-channel signal mixing at the end of a digital up converter. On one hand, it is desired to maximize time sharing of the hardware resources (e.g. comb and integrator modules in CIC, and logic modules in NCOs), which allows three-fold of time division multiplexing (TDM) in CIC and NCO given the 96× clock rate. Fully utilizing TDM also implies fewer hardware duplications. On the other hand, the complexity of the control logic that aligns the CIC filter output with NCO carriers should be as simple as possible. At a 96× clock rate, 6 instances of CIC and 2 instances of NCO should be sufficient to support 16 data channels and 4 carriers. This leaves 18 data slots in CIC and 6 carrier slots in NCO. The challenge is to distribute the 16

CIC data channels onto 18 TDM slots, as well as to design the NCO carriers so that they can mix with the correct data channels.

The DUC of FIG. 6 uses six CICs instead of eight, as well as three-fold TDM as shown in the cycle count in the last stage. FIR 602 doubles the sample rate, followed by FIR 604 that doubles the sample rate again. Thus, the combination of FIRs 602 and 602 quadruples the sample rate. Each of the six CICs further increases the sample rate by a factor of 8. At the output of CIC 606, the number of instances is 6 instead of 8, and the cycle count is 3 instead of 2. NCO 608 also operates under a cycle of 3 instead of 2.

Figure 7:
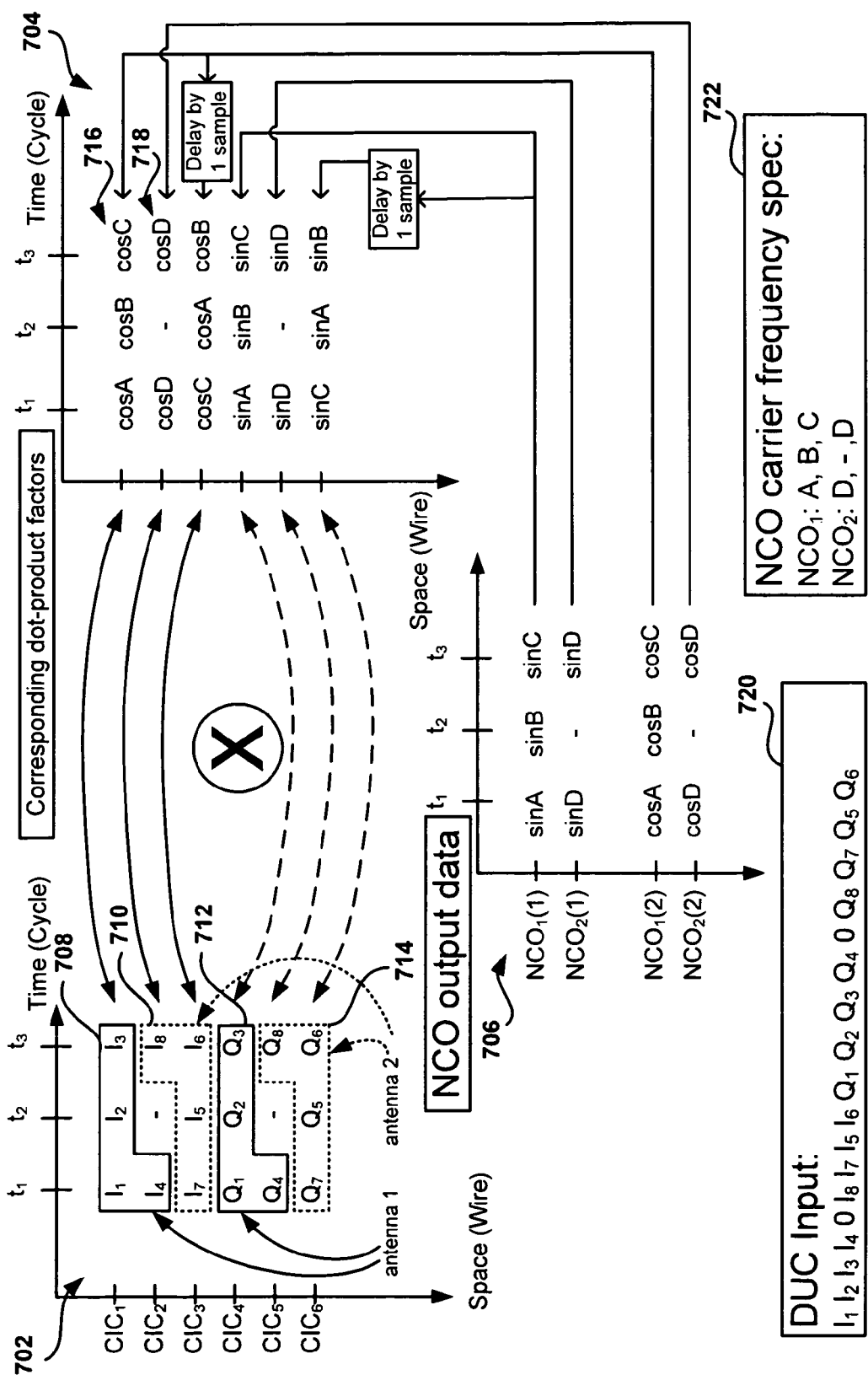
FIG. 7 illustrates the computations performed for one embodiment of a three-fold TDM DUC.

FIG. 7 illustrates the computations performed for one embodiment of a three-fold TDM DUC. FIG. 7 shows how to implement the sample rate table of FIG. 6. The DUC uses dummy input signals and special NCO signal manipulation to take advantage of full TDM folding. In particular, the DUC input signals to the system (see box 720) are arranged as follows:

$$I_1 I_2 I_3 I_4 0 I_8 I_7 I_5 I_6 Q_1 Q_2 Q_3 Q_4 0 Q_6 Q_7 Q_5 Q_6 \quad (3)$$

The presence of a 0 in the sequence corresponds to the dummy inputs. Since the circuit uses three-fold TDM and there are six CICs, this means that there are 18 "slots" corresponding to outputs from the CICs in each complete TDM cycle. Since there are 18 slots and 16 inputs, two dummy inputs are used. The NCO carrier frequencies (see box 722) are defined as follows:

$$NCO_1:A,B,C \quad (4)$$

$$NCO_1:D,-,D \quad (5)$$

The frequency corresponding to the '−' is a "don't care" because the output of $NCO_2$ during $t_2$ is not used. In summary, two dummy channels are introduced, the data channels for the 2nd antenna are rearranged, and the NCOs are reconfigured to generate carriers that are symmetrical on the second wire. This arrangement of the input data makes the filter chain output more symmetrical, and the NCO output is cyclically shifted to match the data channels, so the data path signal can be mixed with the NCO output. The signal summation and separation for different antennas is also addressed through the embodiments.

Diagram 706 shows the NCO output data. This data is further processed by using a delay of one time period for certain signals. For example, $NCO_1(1)$ corresponds to the output of $NCO_1$ in the first wire which is (sin A, sin B, sin C). This output lines up properly with the output of $CIC_4$ (Q1, Q2, Q3). In addition, the output of $NCO_1(1)$ delayed by 1 sample is (sin C, sin A, sin B), which lines up with the output from $CIC_6$. Diagram 704 describes how the NCO output data from diagram 706 is arranged, including the delay signals, to match the CIC outputs shown in diagram 702. For example, line 716 of diagram 704 is combined with the output from $CIC_1$ as seen in diagram 708, line 718 is combined with the output from $CIC_2$, etc.

It should also be noted in diagram 702, that the relationship between the inputs and the antennas is not as symmetrical as in the two-fold TDM DUC. Boxes 708 and 712 show the outputs needed for the calculation of equation (1) for antenna 1, and boxes 710 and 714 show the outputs needed for equation (2) corresponding to antenna 2.

Figure 8:
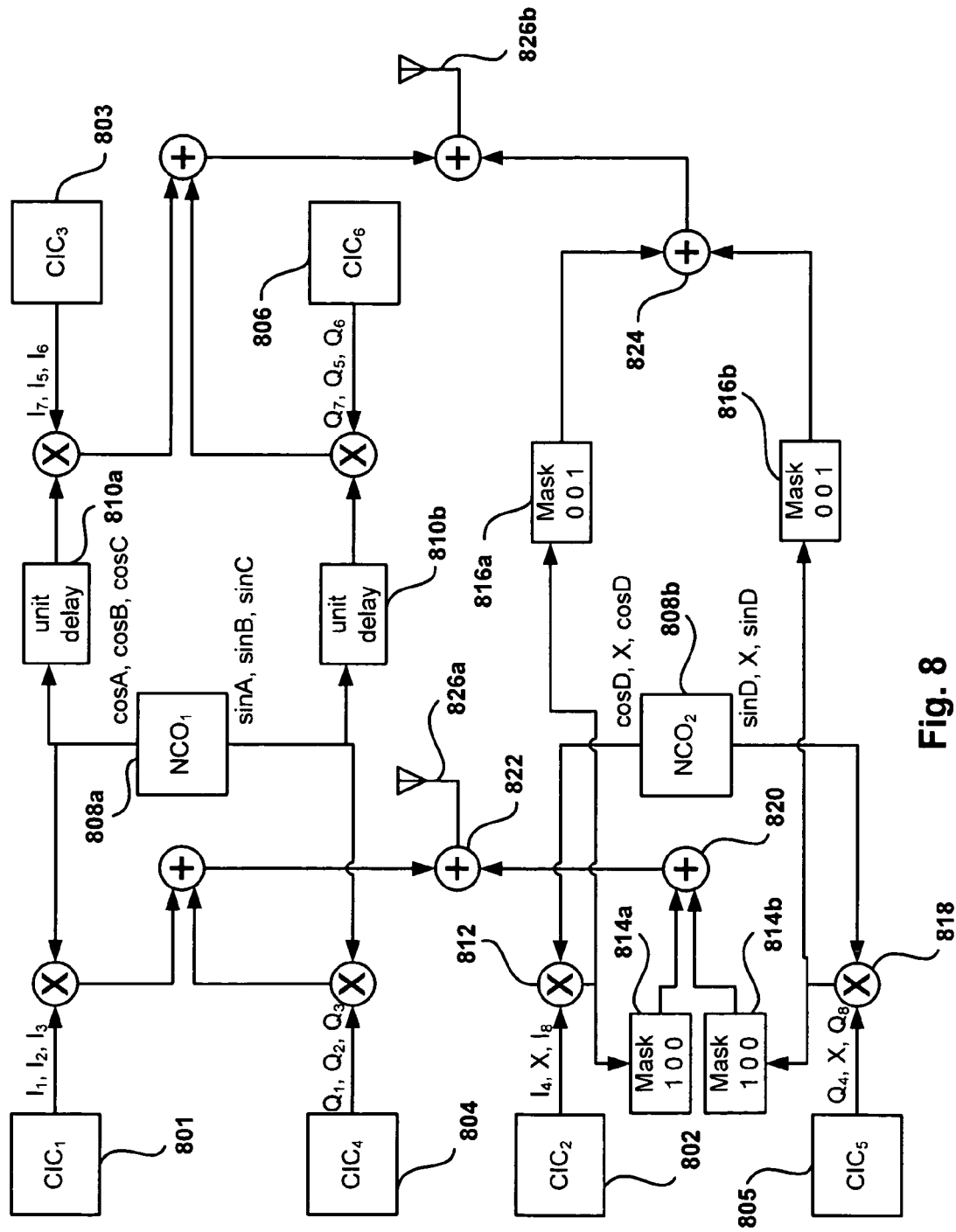
FIG. 8 illustrates a diagram for building a three-fold TDM DUC using six CICs in accordance with one embodiment of the invention.

FIG. 8 illustrates a diagram for building a three-fold TDM DUC using six CICs in accordance with one embodiment of the invention. The top half of FIG. 8 is similar to the layout in FIG. 5, except that three-fold TDM is used. Additionally, unit delays 810a and 810b are added to create cyclic shift of carriers without having to duplicate NCO hardware, as discussed previously in reference to FIG. 7. $NCO_1$ 808a generates (cos A, cos B, cos C) and (sin A, sin B, sin C) in its two outputs. $NCO_2$ 808b generates (cos D, X, cos D) and (sin D, X, sin D), where X represents "don't-care" because it is not used.

The bottom section of FIG. 8 differs from the corresponding section in FIG. 5, as only two CICs are present and masks are used to block dummy signals and to select the right signals for antenna 1 826a and antenna 2 826b. Masks (1, 0, 0) 814a-814b are used to select the first sample of a three-fold TDM output. Masks (0, 0, 1) 816a-b select the last sample of a three-fold TDM output. Each mask can be implemented with a two-bit counter, in one embodiment. The flow control and the channel signal indicate the channel number of the current output at any time instant. The channel signal is used with a simple comparator as the mask to select the first and third sample, respectively. This layout allows mixing and summation with minimal control logic overhead.

Figure 9:
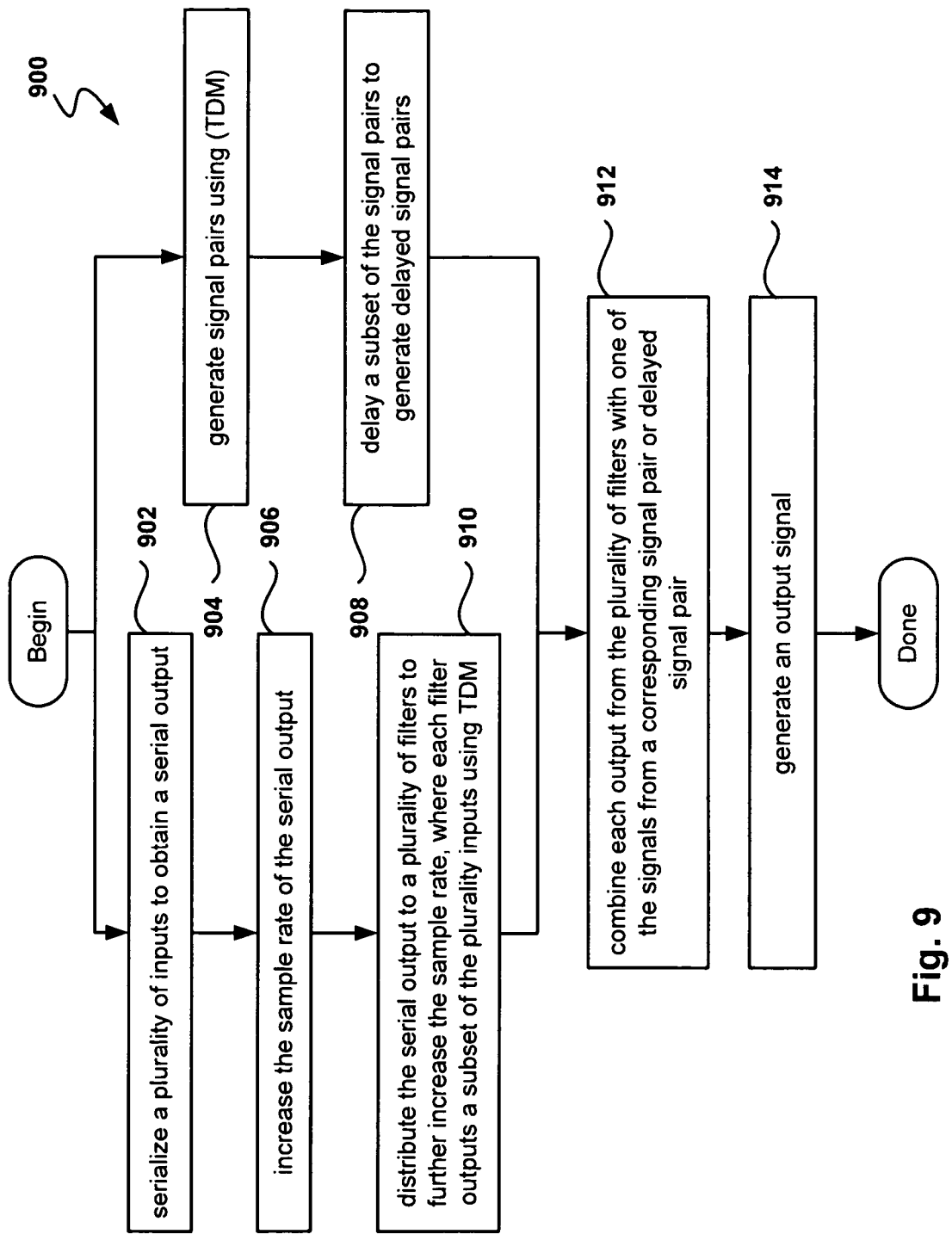
FIG. 9 shows the flow of an algorithm for implementing a digital up converter (DUC) in an integrated circuit (IC), in accordance with one embodiment of the invention.

FIG. 9 shows the flow of an algorithm for implementing a digital up converter (DUC) in an integrated circuit (IC), in accordance with one embodiment of the invention. In operation 902, a plurality of inputs is serialized to obtain a serial output. In one embodiment, the inputs are serialized by multiplexer 202 of FIG. 2. Further, the sample rate of the serial output is increased in operation 906. For example, FIR 602 and 604 of FIG. 6 double the sample rate before transmitting the result to CIC 606, which, in one embodiment, includes 6 different CIC filters as shown in FIG. 8.

In operation 910, the serial output with the increased sample rate is distributed to a plurality of filters, which further increase the sample rate. Each of the filters in the plurality of filters outputs a subset of the original inputs, as seen in FIG. 8. For example, $CIC_1$ 801 outputs inputs $I_1$, $I_2$, and $I_3$, $CIC_2$ 802 outputs $I_1$ and $I_8$, $CIC_4$ 804 outputs $Q_1$, $Q_2$, and $Q_3$, etc.

Sinusoidal signal pairs are generated in operation 904. The signal pairs are sine and cosine values for the carrier frequencies, such as frequencies A, B, C, and D of FIGS. 4 and 7. Further, in operation 908, some of the signal pairs are delayed in order to facilitate the alignment of inputs with the corresponding carriers. See for example, unit delays 810a-b of FIG. 8.

In operation 912 the outputs from the plurality of filters are combined with the signal pairs or the delayed signal pairs. In operation 914, the output signal is generated for the DUC. FIGS. 7 and 8 illustrate how the different inputs are combined with the sine and cosine functions to obtain the desired outputs destined for antennas 826a and 826b, in one embodiment. The desired outputs for the antennas generated in operation 914 correspond to functions 218a and 218b shown in FIG. 2.

The methods and systems for implementing a digital up converter (DUC) in an integrated circuit (IC), described herein may be incorporated into any suitable integrated circuit. For example, the methods, and systems may be incorporated into other types of programmable logic devices such as programmable array logic (PAL), programmable logic array (PLA), field-programmable gate array (FPGA), field programmable logic array (FPLA), electrically programmable logic devices (EPLD), electrically erasable programmable logic device (EEPLD), logic cell array (LCA), application-specific integrated circuit (ASIC) just to name a few. The programmable logic device may be a part of a data processing system that includes one or more of the following components: a processor, memory; I/O circuitry, and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a network.

With the above embodiments in mind, it should be understood that the invention can employ various computer-implemented operations involving data stored in computer systems. These operations are those requiring physical manipulation of physical quantities. Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

One or more embodiments of the present invention can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for implementing a digital up converter (DUC) in an integrated circuit (IC), the method comprising:
    serializing a plurality of inputs to obtain a serial output;
    increasing a sample rate of the serial output;
    generating signal pairs using time division multiplexing (TDM);
    delaying a subset of the signal pairs to generate delayed signal pairs;
    distributing the serial output to a plurality of filters to further increase the sample rate, each filter outputting a subset of the plurality of inputs using TDM;
    combining each output from the plurality of filters with one of the signals from a corresponding signal pair or delayed signal pair; and
    generating an output signal.

2. The method as recited in claim 1,
    wherein the plurality of inputs is 8 input pairs, each input pair being a real and an imaginary part of a complex signal;
    wherein the TDM is a three-fold TDM.

3. The method as recited in claim 2, further including:
    adding two dummy outputs to the outputs of the filters, wherein the plurality of filters is 6 filters, each filter increasing the sample rate by a factor of 8;
    where in each TDM cycle a total output from the plurality of filters includes the 8 pairs of inputs and the two dummy outputs.

4. The method as recited in claim 1,
    wherein a signal pair includes a sine and a cosine for one carrier frequency;
    wherein the output signal includes 4 carrier frequencies;
    wherein generating signal pairs further includes:
        outputting by a first numerically controlled oscillator (NCO) signal pairs for frequencies A, B, and C in a TDM cycle; and
        outputting by a second NCO signal pairs for frequency D in a first and last periods of the TDM cycle.

5. The method as recited in claim 4, wherein delaying further includes delaying by one period of the TDM cycle the output of the first NCO.

6. The method as recited in claim 5, wherein the plurality of inputs is 8 input pairs, wherein combining each output further includes:
    multiplying the output from the first NCO by first, second, and third input pairs respectively;
    multiplying the output from the second NCO by a fourth input pair, a dummy output pair, and an eight input pair respectively; and
    multiplying the delayed output from the first NCO by seventh, fifth, and sixth input pairs respectively.

7. The method as recited in claim 6, wherein combining each output further includes:
    masking the multiplication including the output from the second NCO, the masking used to filter the dummy output pair.

8. The method as recited in claim 1 wherein increasing a sample rate includes augmenting the sample rate by a factor of 4.

9. A digital up converter (DUC) in an integrated circuit (IC), the DUC comprising:
    a multiplexer that serializes a plurality of inputs to obtain a serial output;
    a first filter that increases a sample rate of the serial output;

a plurality of numerically controlled oscillators (NCO), each NCO generating a signal pair;

unit delay modules that delay one of the signal pairs to generate delayed signal pairs;

a plurality of second filters that receive the serial output from the first filter to further increase the sample rate, each second filter outputting a subset of the plurality of inputs; and combination logic circuitry to generate an output signal by combining the second filter outputs and one of a signal pair or a delayed signal pair.

10. The DUC of claim 9, further including:

a plurality of mask modules, wherein each mask module filters out signals corresponding to a dummy input and signals corresponding to different antennas.

11. The DUC of claim 9 wherein the first filter includes two finite impulse response (FIR) filters serially connected, each FIR filter doubling the sample rate.

12. The DUC of claim 9 wherein the second filters are 6 cascaded integrator comb (CIC) filters, each CIC filter multiplying by 8 the sample rate.

13. The DUC of claim 9 wherein the combination logic circuitry generates the output signal for a first antenna and the combination logic circuitry further generates a second output signal for a second antenna.

14. The DUC of claim 9, wherein the plurality of inputs is 16 inputs, each input having a sample rate of 3.84 MHz;

wherein the clock rate of the IC is 368.64 MHz.

15. The DUC of claim 9, wherein the second filters and the NCOs operate in three-fold time division multiplexing (TDM) mode.

16. A digital up converter (DUC) in an integrated circuit (IC), the DUC comprising:

a multiplexer that serializes a plurality of inputs to obtain a serial output;

a first filter that increases a sample rate of the serial output;

a plurality of numerically controlled oscillators (NCO), each NCO generating a signal pair;

a plurality of second filters that receive the serial output from the first filter to further increase the sample rate, each second filter outputting a subset of the plurality of inputs;

a plurality of mask modules; and combination logic circuitry to generate an output signal by combining second filter outputs and one of a signal pair or a delayed signal pair;

wherein each mask module filters out signals corresponding to a dummy input and signals corresponding to a different antenna.

17. The DUC of claim 16, further including:

a unit delay module that delay one of the signal pairs to generate the delayed signal pair.

18. The DUC of claim 16, wherein each mask module is a two-bit counter.

19. The DUC of claim 16, wherein a clock rate of the IC is equal to 96 times a sample rate from each of the plurality of inputs, wherein the plurality of second filters and the plurality of NCOs operate in three-fold time division multiplexing (TDM) mode.

20. The DUC of claim 16, wherein the DUC is part of a wideband code division multiple access (WCDMA) baseband modem.

* * * * *